(12) United States Patent
Cheng et al.

(10) Patent No.: US 12,057,312 B2
(45) Date of Patent: Aug. 6, 2024

(54) SEMICONDUCTOR STRUCTURE MANUFACTURING METHODS AND SEMICONDUCTOR STRUCTURES

(71) Applicant: ENKRIS SEMICONDUCTOR, INC., Jiangsu (CN)

(72) Inventors: Kai Cheng, Jiangsu (CN); Liyang Zhang, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 78 days.

(21) Appl. No.: 17/616,170

(22) PCT Filed: Apr. 26, 2020

(86) PCT No.: PCT/CN2020/087040
§ 371 (c)(1),
(2) Date: Dec. 2, 2021

(87) PCT Pub. No.: WO2021/217302
PCT Pub. Date: Nov. 4, 2021

(65) Prior Publication Data
US 2022/0246424 A1  Aug. 4, 2022

(51) Int. Cl.
*H01L 21/02* (2006.01)

(52) U.S. Cl.
CPC .... *H01L 21/0254* (2013.01); *H01L 21/02428* (2013.01); *H01L 21/02483* (2013.01);
(Continued)

(58) Field of Classification Search
CPC ........... H01L 21/0254; H01L 21/02428; H01L 21/02483; H01L 21/02513;
(Continued)

(56) References Cited

U.S. PATENT DOCUMENTS

| | | | |
|---|---|---|---|
| 6,015,979 A | 1/2000 | Sugiura et al. | |
| 2006/0273343 A1* | 12/2006 | Nakahata | H01L 21/0254 257/103 |
| 2015/0050800 A1* | 2/2015 | Brand | H01L 21/0262 438/478 |

FOREIGN PATENT DOCUMENTS

| | | |
|---|---|---|
| CN | 102723416 A | 10/2012 |
| CN | 104332541 A | 2/2015 |

(Continued)

OTHER PUBLICATIONS

ISA State Intellectual Property Office of the People's Republic of China, International Search Report Issued in Application No. PCT/CN2020/087040, Jan. 27, 2021, WIPO, 5 pages.
(Continued)

*Primary Examiner* — Jay C Kim
*Assistant Examiner* — Woo K Lee
(74) *Attorney, Agent, or Firm* — Christopher R. Carroll; The Small Patent Law Group, LLC

(57) ABSTRACT

The present invention provides a manufacturing method of a semiconductor structure and a semiconductor structure. The manufacturing method includes: providing a substrate; forming an amorphous layer on the substrate, wherein the amorphous layer includes a plurality of patterns to expose part of the substrate; forming a metal nitride layer on the amorphous layer; removing the amorphous layer to form a plurality of cavities between the substrate and the metal nitride layer; removing the substrate to form the semiconductor structure. In the present invention, an amorphous layer is formed on the substrate, and a metal nitride layer is formed on the amorphous layer. The amorphous layer can inhibit slip or dislocation during epitaxial growth, thereby improving the quality of the metal nitride layer and improv-
(Continued)

ing the performance of the semiconductor structure, while the metal nitride layer can realize self-supporting.

11 Claims, 2 Drawing Sheets

(52) U.S. Cl.
CPC .. *H01L 21/02513* (2013.01); *H01L 21/02595* (2013.01); *H01L 21/02598* (2013.01); *H01L 21/02378* (2013.01); *H01L 21/02381* (2013.01); *H01L 21/0242* (2013.01)

(58) Field of Classification Search
CPC ......... H01L 21/02595; H01L 21/02598; H01L 21/02378; H01L 21/02381; H01L 21/0242
See application file for complete search history.

(56) References Cited

FOREIGN PATENT DOCUMENTS

| CN | 104465925 | A |   | 3/2015 |   |
|----|-----------|---|---|--------|---|
| CN | 106784182 | A | * | 5/2017 | ......... H01L 33/0075 |
| CN | 106784182 | A |   | 5/2017 |   |
| CN | 107768234 | A |   | 3/2018 |   |
| CN | 109585270 | A |   | 4/2019 |   |

OTHER PUBLICATIONS

ISA State Intellectual Property Office of the People's Republic of China, Written Opinion of the International Searching Authority Issued in Application No. PCT/CN2020/087040, Jan. 27, 2021, WIPO, 5 pages.(Submitted with Machine/Partial Translation).
TW Patent Office, Office Action Issued in Application No. 110112470, May 22, 2023, 10 pages. (Submitted with Machine Translation).

* cited by examiner

SEMICONDUCTOR STRUCTURE MANUFACTURING METHODS AND SEMICONDUCTOR STRUCTURES

TECHNICAL FIELD

This present invention relates to the field of semiconductor, and in particular, to a method of manufacturing semiconductor structure and a semiconductor structure.

BACKGROUND

GaN, as a wide bandgap semiconductor material, has spread application prospects, but manufacturing high-quality GaN epitaxial layers is quite difficult. For example, when manufacturing a GaN epitaxial layer on a commonly used Si substrate, due to the melting back reaction between Ga and Si substrate at high temperature, the epitaxial layer is destroyed, so a metal nitride layer with a certain thickness such as an AlN layer needs to be manufactured in advance. However, there is a huge lattice mismatch between the AlN layer and the Si substrate, and the surface mobility of Al atom is low. Therefore, how to obtain high quality AlN epitaxial layer on a Si substrate is very important for the crystal quality of subsequent epitaxial layer.

SUMMARY

A method of manufacturing a high-quality semiconductor structure and a semiconductor structure is provided in the invention.

A manufacturing method of a semiconductor structure is provided in the present invention, including: providing a substrate; forming an amorphous layer on the substrate, where the amorphous layer includes a plurality of patterns to expose part of the substrate; forming a metal nitride layer on the amorphous layer; removing the amorphous layer to form a plurality of cavities between the substrate and the metal nitride layer; removing the substrate to form the semiconductor structure.

Further, forming the metal nitride layer on the amorphous layer includes: forming a metal nitride film layer on the amorphous layer; converting the polycrystalline film layer of the metal nitride film layer into a monocrystalline film layer to form the metal nitride layer; where the metal nitride film layer includes a monocrystalline film layer in contact with the substrate and a polycrystalline film layer in contact with the amorphous layer.

Further, the polycrystalline film layer of the metal nitride film layer is converted into a monocrystalline film layer by annealing process.

Further, the amorphous layer is removed by etching process.

Further, the amorphous layer is separated from substrate and the metal nitride layer in a lateral direction after being etched, the lateral direction is perpendicular to the arrangement direction of the substrate and the metal nitride layer.

Further, the pattern is a convex pattern, the orthographic projection of the pattern on the substrate is a rectangle, triangle, polygon or circle.

Further, a material of the amorphous layer includes $SiO_2$.

Further, the substrate is a monocrystalline substrate, the monocrystalline substrate is a sapphire substrate, silicon substrate or silicon carbide substrate.

Further, a material of the metal nitride layer includes a AlN-based material.

A semiconductor structure is provided in the present invention, including a plurality of main body parts and a plurality of support parts, where each of the support parts connects two adjacent main body parts, and each of the main body parts and the two adjacent support parts enclose a cavity.

In the present invention, an amorphous layer is formed on the substrate, and a metal nitride layer is formed on the amorphous layer. The amorphous layer can inhibit slip or dislocation during epitaxial growth, thereby improving the quality of the metal nitride layer and improving the performance of the semiconductor structure.

DETAILED DESCRIPTION OF THE EMBODIMENTS

Figure 1:
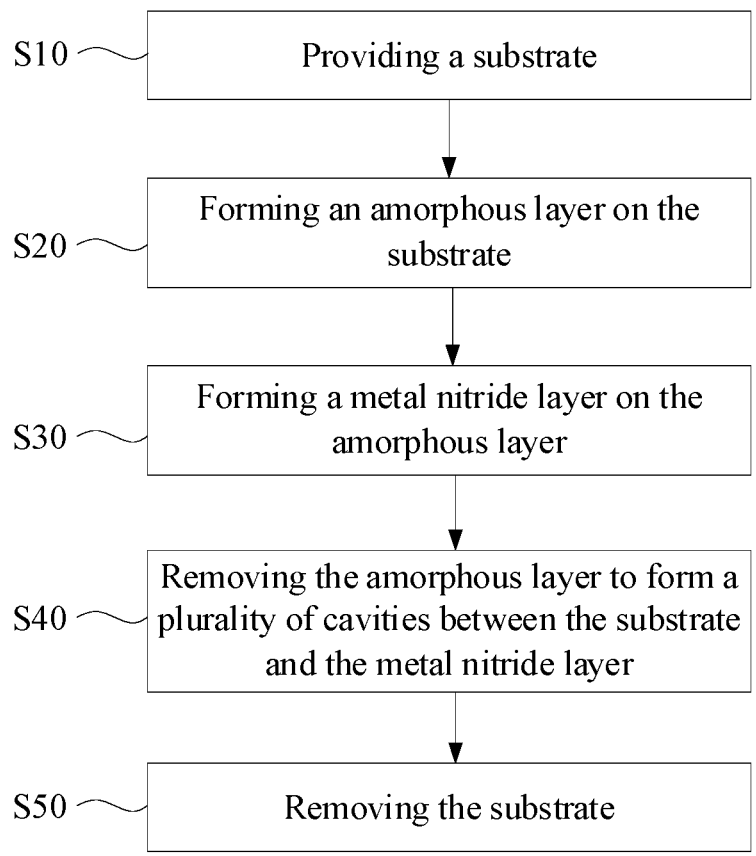
FIG. 1 is a schematic flowchart of a method of manufacturing a semiconductor structure according to an embodiment of the present invention.
Figure 2:
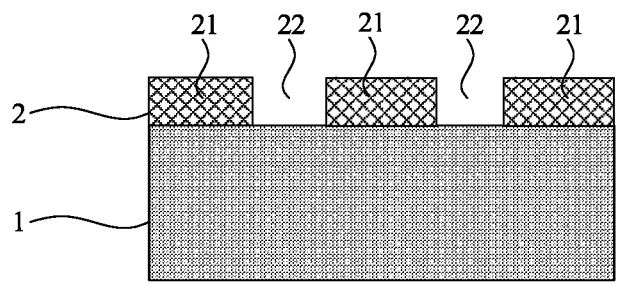
FIG. 2 is a schematic diagram illustrating forming an amorphous layer on a substrate in the manufacturing method shown in FIG. 1.
Figure 3:
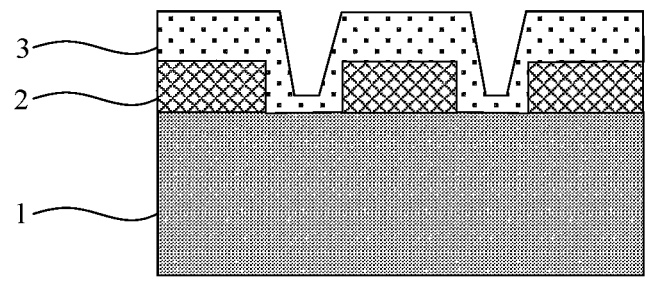
FIG. 3 is a schematic diagram illustrating forming a metal nitride layer on an amorphous layer in the manufacturing method shown in FIG. 1.
Figure 4:
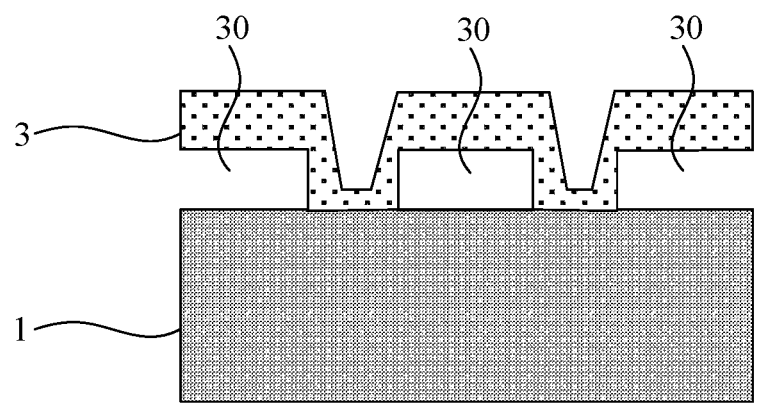
FIG. 4 is a schematic diagram illustrating a structure after removing the amorphous layer in the manufacturing method shown in FIG. 1.

Exemplary embodiments will be described in detail herein, and examples thereof are shown in the accompanying drawings. When the following description refers to the drawings, unless otherwise indicated, the same numerals in different drawings indicate the same or similar elements. The exemplary embodiments described in the following do not represent all the embodiments consistent with the present invention. On the contrary, they are merely examples of devices consistent with some aspects of the invention as detailed in the appended claims.

The terms used in the present invention are only for the purpose of describing specific embodiments, and are not intended to limit the present invention. Unless otherwise defined, the technical terms or scientific terms used in the present invention shall have the usual meanings understood by those with ordinary skills in the field to which the present invention belongs. The "first", "second" and similar words used in the description and claims of the present invention do not denote any sequence, quantity or importance, but are only used to distinguish different components. Similarly, similar words such as "a" or "an" do not mean a quantity limit, but mean that there is at least one, and "multiple" or "a plurality of" means two or more. Unless otherwise indicated, similar words such as "front", "rear", "lower" and/or "upper" are only for convenience of describing, and are not limited to one position or one spatial orientation. "Include" or "comprise" and other similar words mean that the components or items presented before "include" or "comprise" cover the components or items listed after "include" or "comprise" and their equivalents, and do not exclude other components or items. Similar words such as "connect" or "couple" are not limited to physical or mechanical connections, and may include electrical connections, whether direct or indirect. The singular forms of "a/an", "said" and "the" used in the description and appended claims of the present invention are also intended to include plural forms, unless the context clearly indicates other meanings. It should also be understood that the term "and/or" as used herein refers to and includes any or all possible combinations of one or more associated listed items.

The present invention provides a manufacturing method of a semiconductor structure, including: providing a substrate; forming an amorphous layer on the substrate, where the amorphous layer includes a plurality of patterns; forming a metal nitride layer on the amorphous layer; removing the amorphous layer to form a plurality of cavities between the substrate and the metal nitride layer.

Please refer to FIGS. 1 to 5, a manufacturing method of semiconductor structure is provided in the embodiment, the manufacturing method including:

Step S10: a substrate 1 is provided.

Step S20: an amorphous layer 2 is formed on the substrate, where the amorphous layer includes a plurality of patterns 21 to expose a part of the substrate.

Step S30: a metal nitride layer 3 is formed on the amorphous layer 2.

Step S40: the amorphous layer 2 is removed to form a plurality of cavities between the substrate 1 and the metal nitride layer 3, the cavities 30 corresponding to the space occupied by the patterns 21 in step S20.

Step S50: the substrate 1 is removed.

Optionally, the step S20 includes: firstly, an amorphous film layer is formed on the substrate 1, and then the amorphous film layer is patterned to form the patterns 21, and to form a channel 22 between adjacent patterns 21. The patterning process is, for example, a photolithography process. The projection of the pattern 21 on the substrate 1 may be a rectangle, a triangle, a polygon (which can be understood as a pentagon or a closed pattern with more sides) or a circle. The pattern 21 can inhibit slip or dislocation of the metal nitride layer 3 during growth, thereby reducing the dislocation density, further improving the quality of the metal nitride layer 3. In this embodiment, the pattern 21 is a convex pattern, that is, the pattern 21 is formed by extending upward; in other embodiments, a plurality of upward notches is formed on the substrate 1, and the pattern 21 is formed in the notch. At this time, the pattern 21 is a concave pattern.

Optionally, the step S30 includes: a metal nitride film layer is formed on the amorphous layer 2, where for the metal nitride film layer, a part in direct contact with the substrate 1 (that is, located in the channel 22) is a monocrystalline film layer, and a part in direct contact with the amorphous layer 2 is a polycrystalline film layer; the polycrystalline film layer of the metal nitride film layer is converted into a monocrystalline film layer to form the metal nitride layer. As a part of the metal nitride film layer is single crystal, the single crystal structure can be conducted to the polycrystalline structure part through the annealing process, so that the polycrystalline structure gradually becomes the single crystal structure, that is, finally, the metal nitride film layer completely becomes a single crystal structure. Through the patterned amorphous layer 2 and the annealing process, a high-quality single crystal metal nitride film can be obtained.

Optionally, in the step S40, the amorphous layer 2 is removed by an etching process, and the amorphous layer 2 is detached/separated from the substrate 1 and the metal nitride layer 3 in the lateral direction after being etched, thus the metal nitride layer will not be damaged during the etching process. The lateral direction is perpendicular to the arrangement direction of the substrate 1 and the metal nitride layer 3.

Optionally, in step S50, the substrate 1 is removed by a lift-off technology. Since the step removing the substrate 1 is after the step removing the amorphous layer 2, when the amorphous layer 2 is removed from the substrate 1, the substrate 1 can still support the metal nitride layer 3 well, and prevent the metal nitride layer 3 from deformation during this step.

Optionally, the substrate is a single crystal substrate. The single crystal substrate can be a sapphire substrate, a silicon substrate or a silicon carbide substrate. The material of the amorphous layer 2 includes silicon oxide such as $SiO_2$. The material of the metal nitride layer 3 includes an AlN-based material. In this embodiment, the AlN-based material is selected. The AlN-based material can be AlN, AlGaN, InAlN, ScAlN, and other materials.

Figure 5:
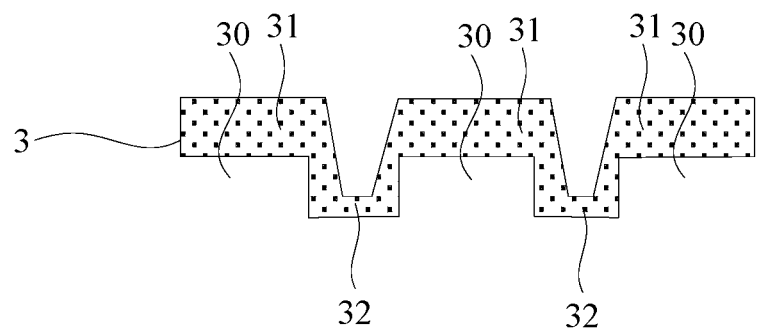
FIG. 5 is a schematic diagram illustrating a semiconductor structure manufactured by the manufacturing method shown in FIG. 1.

Please refer to FIG. 5, a semiconductor structure (actually a metal nitride layer 3) manufactured by the manufacturing method in any one of the previously described embodiments is shown. The semiconductor structure 3 includes a plurality of main body parts 31 and a plurality of supporting parts 32. The supporting part 32 connects two adjacent main body parts. The main body part 31 and the supporting part 32 are at least partially staggered, to make the main body part 31 and two adjacent supporting parts 32 enclose a cavity 30. In this embodiment, the cavity 30 is open on one side. FIG. 5 only shows a part of the semiconductor structure, which results the cavities on both sides being different from a cavity in the middle, but actually cavities are the same. The semiconductor structure 3 can be self-supporting. The self-supporting can be understood as: it can maintain its own shape without defects during processing. At the same time, the metal nitride layer of the semiconductor has a low dislocation density and a high quality, which is beneficial to further manufacturing a high-quality GaN structure.

In another aspect, a resonator is provided in the present invention, which includes the semiconductor structure in any one of the previously described embodiments. Generally, the resonator needs to form a cavity structure in its substrate. However, the semiconductor structure manufactured by the previously described manufacturing method has a plurality of cavities 30. The cavities 30 can replace cavity structure of the substrate. Therefore, the semiconductor structure can be used directly to manufacture the resonator without forming a cavity in the substrate of the resonate by other processes, which is beneficial to simplify the manufacturing process and reduce the manufacturing cost.

In other embodiments, the semiconductor structure can also be used to make LED chips.

In the present invention, an amorphous layer is formed on the substrate, and a metal nitride layer is formed on the amorphous layer. The amorphous layer can inhibit slip or dislocation during epitaxial growth, thereby improving the quality of the metal nitride layer and improving the performance of the semiconductor structure, while the metal nitride layer can realize the self-supporting. The semiconductor structure can be directly used to make the resonator, which is beneficial to simplify the manufacturing process of the resonator.

The above are only some embodiments of the present invention, and do not limit the present invention in any form. Although the present invention has been disclosed in some embodiments, it is not intended to limit the present invention. Without departing from the scope of the technical solution of the present invention, slight changes or modification into equivalent implementations with equivalent changes made by any person skilled in the art when using the technical content disclosed above, but any content that does not depart from the technical solution of the present invention and any of simple modifications, equivalent changes and modifications to the above embodiments based on the technical essence of the invention still fall within the scope of the technical solutions of the present invention.

The invention claimed is:

1. A method of manufacturing a semiconductor structure, comprising:
providing a substrate;
forming an amorphous layer on the substrate, wherein the amorphous layer comprises a plurality of patterns to expose a part of the substrate, each of the patterns extending upward from the substrate, and a projection of the patterns onto the substrate includes closed patterns each having a plurality of sides and spaced apart from others of the closed patterns;
forming a metal nitride layer on the amorphous layer;
removing the amorphous layer to form a plurality of cavities between the substrate and the metal nitride layer, wherein locations of the plurality of cavities correspond to spaces occupied by the patterns; and
removing the substrate to form the semiconductor structure, such that the metal nitride layer comprises a plurality of main body parts and a plurality of support parts, wherein each of the support parts connects two adjacent ones of the main body parts, each of the main body parts is spaced apart from the substrate by one of the cavities, each of the support parts contacts the substrate between the cavities and extends away from the substrate to the main body parts, and one of the main body parts and two of the support parts that are adjacent to the one of the main body parts enclose one of the plurality of cavities; and the metal nitride layer is self-supporting.

2. The method of manufacturing the semiconductor structure according to claim 1, wherein forming the metal nitride layer on the amorphous layer comprises:
forming a metal nitride film layer on the amorphous layer, wherein the metal nitride film layer comprises a monocrystalline film layer in contact with the substrate and a polycrystalline film layer in contact with the amorphous layer; and
converting the polycrystalline film layer into the monocrystalline film layer to form the metal nitride layer.

3. The method of manufacturing the semiconductor structure according to claim 2, wherein the polycrystalline film layer of the metal nitride film layer is converted into a monocrystalline film layer by an annealing process.

4. The method of manufacturing the semiconductor structure according to claim 1, wherein the amorphous layer is removed by an etching process.

5. The method of manufacturing a semiconductor structure according to claim 4, wherein the amorphous layer is separated from substrate and the metal nitride layer after being etched.

6. The method of manufacturing the semiconductor structure according to claim 1, wherein each of the patterns is a convex pattern, and an orthographic projection of the pattern on the substrate is a rectangle, a triangle, a polygon or a circle.

7. The method of manufacturing the semiconductor structure according to claim 1, wherein a material of the amorphous layer comprises $SiO_2$.

8. The method of manufacturing the semiconductor structure according to claim 1, wherein the substrate is a monocrystalline substrate, and the monocrystalline substrate is a sapphire substrate, a silicon substrate or a silicon carbide substrate.

9. The method of manufacturing the semiconductor structure according to claim 1, wherein a material of the metal nitride layer comprises an AlN-based material.

10. A semiconductor structure, comprising a substrate and a self-supporting metal nitride layer, the metal nitride layer having a plurality of main body parts and a plurality of support parts, each of the main body parts spaced apart from the substrate by a cavity, each of the support parts contacting and extending away from the substrate to the main body parts, each of the support parts connecting two adjacent ones of the main body parts, one of the main body parts and two of the support parts that are adjacent to the one of the main body parts enclose one of the cavities, each of the main body parts.

11. A resonator, comprising a semiconductor structure, wherein the semiconductor structure comprises: a substrate and a self-supporting metal nitride layer, the metal nitride layer including a plurality of main body parts and a plurality of support parts, each of the main body parts spaced apart from the substrate by one of plural cavities, each of the support parts contacting the substrate between the cavities and extending away from the substrate to the main body parts, wherein each of the support parts connects two adjacent ones of the main body parts, and one of the main body parts and two of the support parts that are adjacent to the one of the main body parts enclose a one of the cavities.

* * * * *